(12) United States Patent
Xiang et al.

(10) Patent No.: US 8,242,017 B2
(45) Date of Patent: Aug. 14, 2012

(54) METHOD AND STRUCTURE FOR COPPER GAP FILL PLATING OF INTERCONNECT STRUCTURES FOR SEMICONDUCTOR INTEGRATED CIRCUITS

(75) Inventors: Yang Hui Xiang, Shanghai (CN); Qing Tang Jiang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 444 days.

(21) Appl. No.: 12/044,254

(22) Filed: Mar. 7, 2008

(65) Prior Publication Data

US 2009/0227103 A1 Sep. 10, 2009

(51) Int. Cl.
 *H01L 21/4763* (2006.01)
(52) U.S. Cl. .. 438/643; 438/642; 438/648; 257/E21.295
(58) Field of Classification Search .................. 438/618, 438/642, 643, 648, 652, 653, 656, 658, 674, 438/675, 677, 687; 257/774, E21.295
See application file for complete search history.

(56) References Cited

U.S. PATENT DOCUMENTS 4,381,977 A * 5/1983 Gaylor et al. ................. 205/434
6,342,448 B1 * 1/2002 Lin et al. ....................... 438/687
6,613,663 B2 * 9/2003 Furuya .......................... 438/613
2005/0054191 A1 3/2005 Yu et al.
2005/0253265 A1 * 11/2005 Barkyoumb et al. ......... 257/751
2006/0223310 A1 * 10/2006 Suzuki .......................... 438/652

FOREIGN PATENT DOCUMENTS

CN 1590597 A 9/2005
CN 1591856 A 9/2005

* cited by examiner

*Primary Examiner* — James Mitchell
*Assistant Examiner* — Colleen E Snow
(74) *Attorney, Agent, or Firm* — Kilpatrick Townsend and Stockton LLP

(57) ABSTRACT

A method for forming an integrated circuit device including an interconnect structure, e.g., copper dual damascene. The method includes providing a substrate and forming an interlayer dielectric layer overlying the substrate. The method also includes patterning the interlayer dielectric layer to form a contact structure and forming a barrier metal layer overlying the contact structure. The method includes forming a seed layer comprising copper bearing species overlying the barrier metal layer and applying an oxygen bearing species to treat the seed layer to cause an oxide layer of predetermined thickness to form on the seed layer. The method protects the seed layer from contamination using the oxide layer while the substrate is transferred from the step of applying the seed layer and contacts a copper bearing material in liquid form overlying the oxide layer to dissolve the oxide layer while forming a thickness of copper bearing material using a plating process to begin filling the contact structure.

18 Claims, 5 Drawing Sheets

METHOD AND STRUCTURE FOR COPPER GAP FILL PLATING OF INTERCONNECT STRUCTURES FOR SEMICONDUCTOR INTEGRATED CIRCUITS

BACKGROUND OF THE INVENTION

The present invention is directed to integrated circuits and their processing for the manufacture of semiconductor devices. More particularly, the invention provides a method and device for manufacturing a metal inter-connect structure having improved gap fill characteristics. Merely by way of example, the invention has been applied to a copper metal structure such as a dual damascene structure for advanced signal processing devices. But it would be recognized that the invention has a much broader range of applicability. For example, the invention can be applied to microprocessor devices, memory devices, application specific integrated circuit devices, as well as various other interconnect structures.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the ability to form interchanging metal and dielectric layers, where the metal layers to not interact with each other in the form of noise.

As merely an example, aluminum metal layers have been the choice of material for semiconductor devices as long as such layers have been used in the first integrated circuit device. Such first integrated circuit device has been described using interconnecting elements with aluminum bearing materials by Robert Noyce. Aluminum had been the choice since it provides good conductivity and sticks to dielectric materials as well as semiconductor materials. Most recently, aluminum metal layers have been replaced, in part, by copper interconnects. Copper interconnects have been used with low k dielectric materials to form advanced conventional semiconductor devices. Copper has improved resistance values of aluminum for propagating signals through the copper interconnect at high speeds. As devices become smaller and demands for integration become greater, limitations in copper and low k dielectric materials include poor gap fill characteristics in copper films, which lead to voids and other undesirable structures. These and other limitations are described throughout the present specification and more particularly below.

From the above, it is seen that an improved technique for processing semiconductor devices is desired.

BRIEF SUMMARY OF THE INVENTION

According to the present invention, techniques for manufacturing integrated circuits are provided. More particularly, the invention provides a method and device for manufacturing a metal inter-connect structure having improved gap fill characteristics. Merely by way of example, the invention has been applied to a copper metal structure such as a dual damascene structure for advanced signal processing devices. But it would be recognized that the invention has a much broader range of applicability. For example, the invention can be applied to microprocessor devices, memory devices, application specific integrated circuit devices, as well as various other interconnect structures.

In a specific embodiment, the invention provides a method for forming an interconnect structure, e.g., copper. The method includes providing a substrate, e.g., silicon wafer. The method includes forming an interlayer dielectric layer (e.g., fluorine doped silica glass, i.e. FSG) overlying the substrate. The method patterns the interlayer dielectric layer to form a contact structure. The method includes forming a barrier metal layer overlying the contact structure and forming a seed layer comprising copper bearing species overlying the barrier metal layer. The method also includes applying an oxygen bearing species to treat the seed layer to cause an oxide layer of predetermined thickness to form on the seed layer. The method protects the seed layer from contamination using the oxide layer while the substrate is transferred from the step of applying the seed layer. The method then includes (contacting a copper bearing material overlying the oxide layer to dissolve the oxide layer while forming a thickness of copper bearing material to fill the contact structure) using a copper plating bath to dissolve the oxide layer and expose the clean seed surface for copper plating.

In an alternative specific embodiment, the invention includes a method for forming an integrated circuit device including an interconnect structure, e.g., copper dual damascene. The method includes providing a substrate and forming an interlayer dielectric layer overlying the substrate. The method also includes patterning the interlayer dielectric layer to form a contact structure and forming a barrier metal layer overlying the contact structure. The method includes forming a seed layer comprising copper bearing species overlying the barrier metal layer and applying an oxygen bearing species to treat the seed layer to cause an oxide layer of predetermined thickness to form on the seed layer. The method protects the seed layer using the oxide layer while the substrate is transferred from the step of applying the seed layer and (contacts a copper bearing material in liquid form overlying the oxide layer to dissolve the oxide layer while forming a thickness of copper bearing material using a plating process to begin filling the contact structure).

Many benefits are achieved by way of the present invention over conventional techniques. For example, the present technique provides an easy way to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved contact structure free from voids, wettability problems, etc. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to embodiments of the present invention, techniques for manufacturing integrated circuits are provided. More particularly, the invention provides a method and device for manufacturing a metal inter-connect structure having improved gap fill characteristics. Merely by way of example, the invention has been applied to a copper metal structure such as a dual damascene structure for advanced signal processing devices. But it would be recognized that the invention has a much broader range of applicability. For example, the invention can be applied to microprocessor devices, memory devices, application specific integrated circuit devices, as well as various other interconnect structures.

Figure 1:
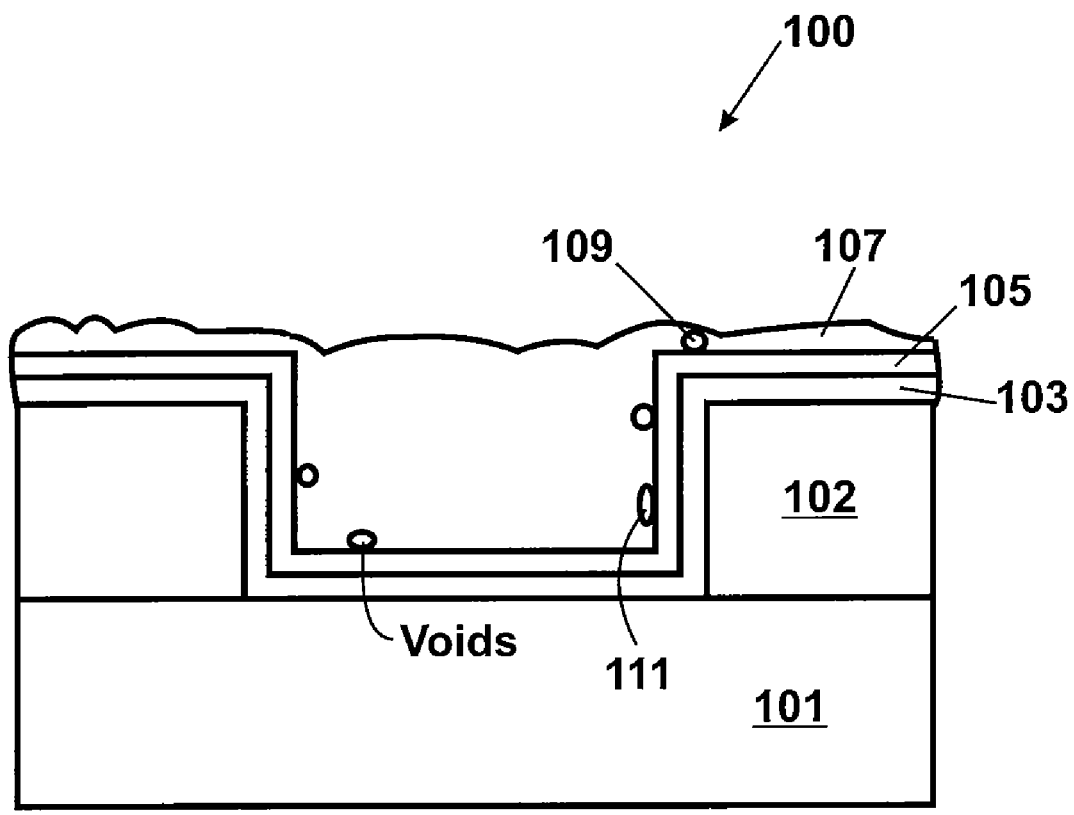
FIG. 1 is a simplified cross-sectional view diagram of an interconnect structure for a conventional copper interconnect.
Figure 2:
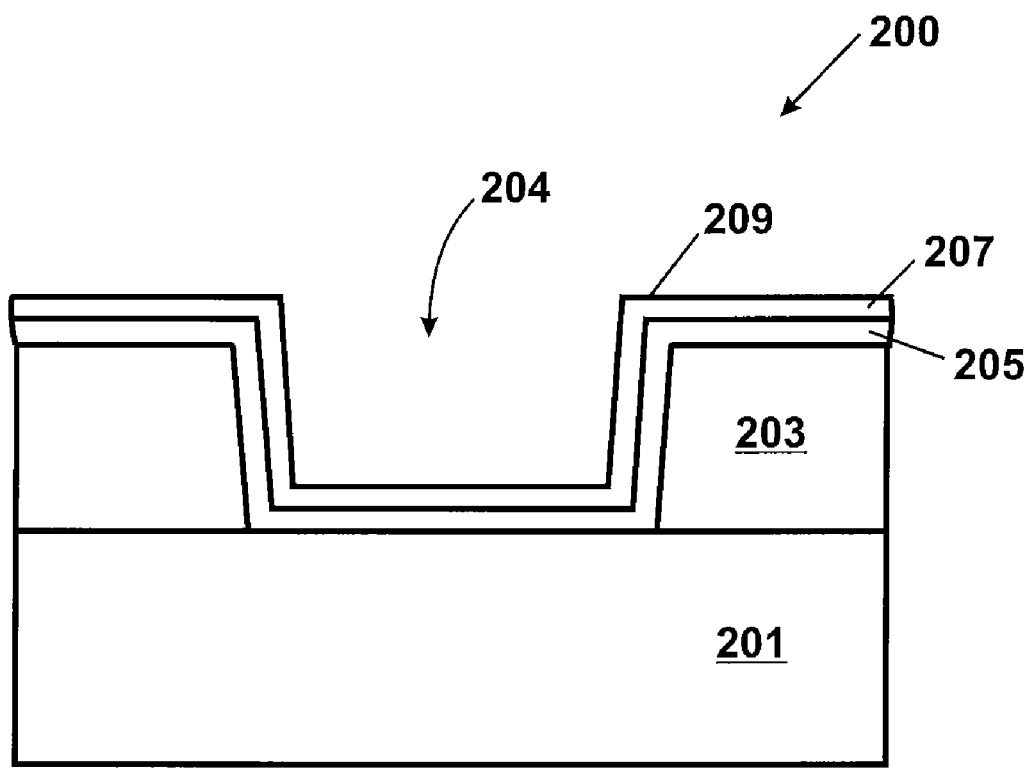
FIGS. 2 through 5 illustrate a method for manufacturing an interconnect structure according to an embodiment of the present invention.

FIG. 1 is a simplified cross-sectional view diagram of an interconnect structure for a conventional copper interconnect. As shown, the diagram 100 includes a substrate 101, which is a silicon substrate. Overlying the substrate is interlayer dielectric 102. An contact structure is formed within the dielectric layer. The contact structure includes barrier metal layer 103, an overlying seed layer 105, and an overlying copper fill layer 107. As shown, the structure also includes voids that are caused by organics or other contaminants 111. In certain embodiments, contaminant 109 would be removed via chemical mechanical planarization or the like. Contaminant 111 is problematic. Contaminant 111 accumulates on surfaces of the seed layer between formation of the seed layer and a subsequent plating process and lead to poor wettability of the seed layer to the copper plating solution. These and other limitations of the conventional structure are described throughout the present specification and more particularly below.

A method for forming an interconnect structure according to the present invention may be provided as follows:

1. Provide a substrate, e.g., silicon wafer;
2. Form an interlayer dielectric layer (e.g., FSG) overlying the substrate;
3. Mask the insulating layer;
4. Pattern the mask;
5. Form a pattern on the interlayer dielectric layer to form a contact structure within the interlayer dielectric layer;
6. Form a barrier metal layer overlying the contact structure;
7. Form a seed layer comprising copper bearing species overlying the barrier metal layer;
8. Apply an oxygen bearing species to treat the seed layer to cause an oxide layer of predetermined thickness to form on the seed layer;
9. Maintain the seed layer and the oxide layer formation after the seed layer deposition without a vacuum break;
10. Protect the seed layer using the oxide layer while the substrate is transferred from the step of applying the seed;
11. Contact a copper bearing material overlying the oxide layer to dissolve the oxide layer while forming a thickness of copper bearing material to fill the contact structure; and
12. Perform other steps, as desired.

The above sequence of steps provides a method according to an embodiment of the present invention. As shown, the method uses a combination of steps including a way of forming a protective layer using an oxide overlying the copper seed layer. Other alternatives can also be provided where steps are added, one or more steps are removed, or one or more steps are provided in a different sequence without departing from the scope of the claims herein. Further details of the present method can be found throughout the present specification and more particularly below.

FIGS. 2 through 5 illustrate a method for manufacturing an interconnect structure according to an embodiment of the present invention. These diagrams are merely examples, which should not unduly limit the scope of the claims herein. One of ordinary skill in the art would recognize many variations, modifications, and alternatives. As shown, the method begins by providing a substrate 201, e.g., silicon wafer, silicon on insulator, epitaxial wafer and the like. The method includes forming an interlayer dielectric layer 203 (e.g., FSG) overlying the substrate. The method patterns the interlayer dielectric layer to form a contact structure 204. The method includes forming a barrier metal layer 205 overlying at least the contact structure. Preferably, the barrier metal layer is tantalum, tantalum nitride, or like material. The barrier layer has a thickness ranging from about 50 Angstroms to about 500 Angstroms. The method then forms a seed layer 207 comprising copper bearing species overlying the barrier metal layer. The seed layer is preferably copper that has been sputtered using a physical vapor deposition process. Alternatively, the seed layer can also be deposited by a chemical vapor deposition process.

Figure 3:
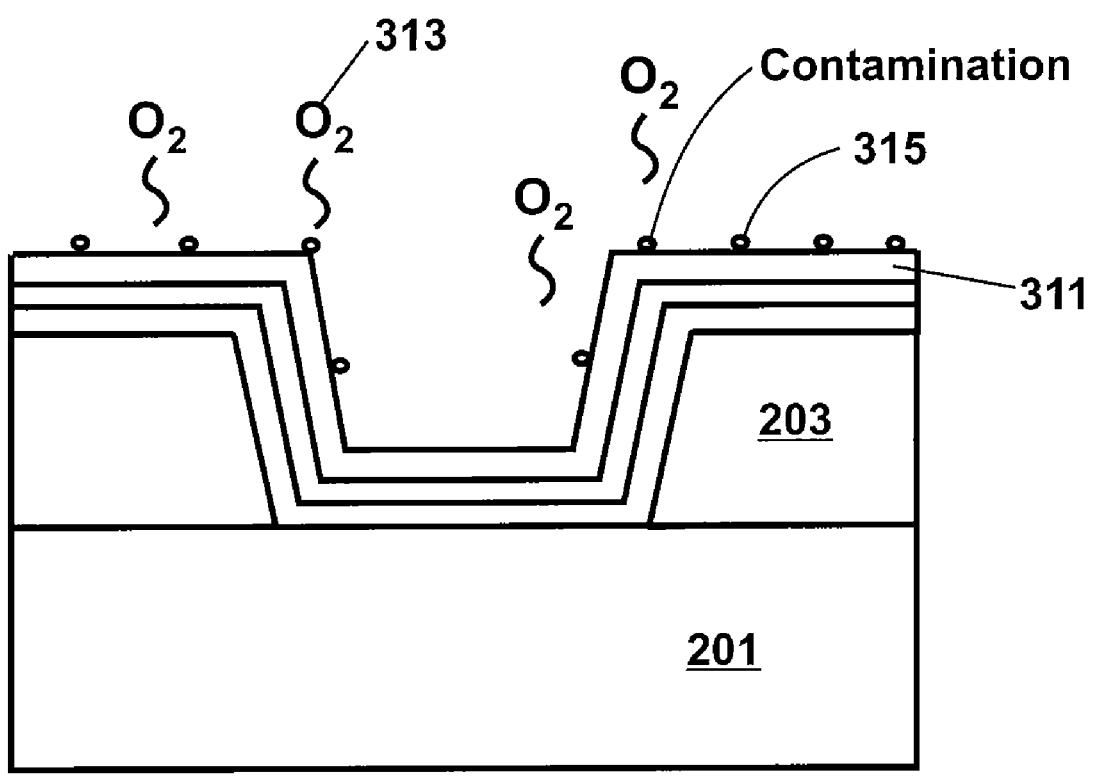

Referring to FIG. 3, the method also includes applying an oxygen bearing species 313 to treat the seed layer to cause an oxide layer 311 of predetermined thickness to form on the seed layer. In a specific embodiment, the oxide layer comprises at least oxides of copper. Preferably, the seed layer and the oxide layer are formed without breaking vacuum. The method protects the seed layer using the oxide layer while the substrate is transferred from the step of applying the seed layer. Vacuum is often broken in the transferring step and the substrate including the copper seed layer is exposed to the outside environment. As shown, certain contaminants 315 may attach themselves to surfaces of the oxide layer.

Figure 4:
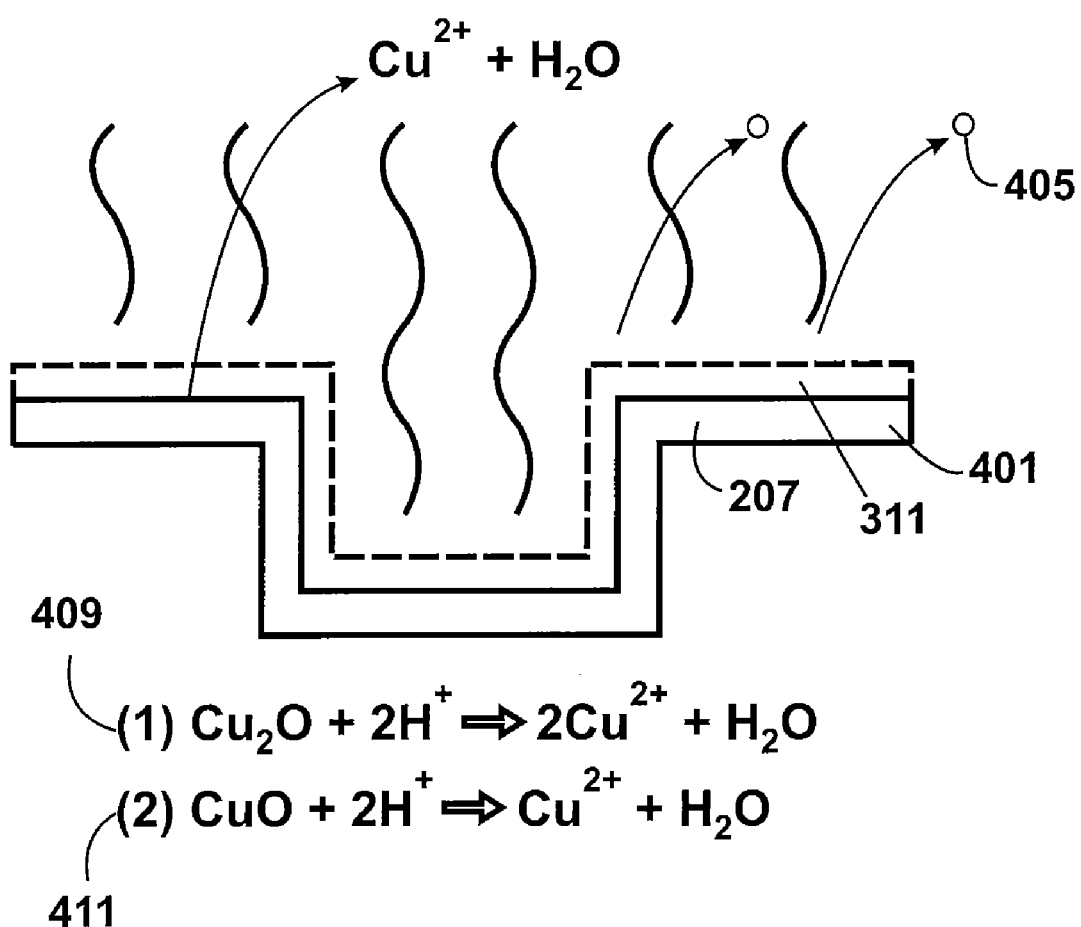
Figure 5:
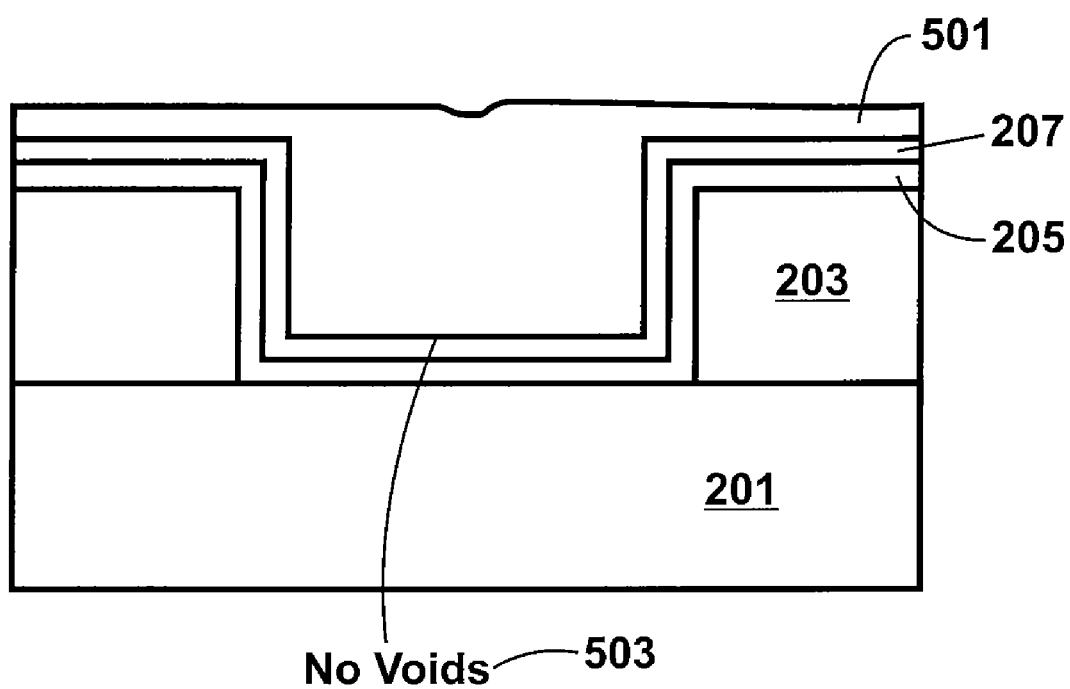

Referring to FIG. 4, the method includes contacting a copper bearing material overlying the oxide layer to dissolve the oxide layer while forming a thickness of copper bearing material to fill the contact structure. Here, the oxide layer 401 is dissolved from the copper seed layer 207. Contaminants 405 also are removed with the dissolving of the oxide layer. The copper oxide becomes soluble as ionic copper and water 407. Depending upon the application, the oxide layer turns into ionic copper, which is soluble in solution by way of reactions 409 and/or 411.

The method then electroplates copper fill layer 501 overlying the seed layer, which is free from contaminants and oxides. Preferably, the copper fill layer is deposited using the best known method (BKM) recipe on a Novelles Sabre system or an Applied Materials' iECP system. As shown, the fill layer is also free from voids 503 and preferably does not suffer from one or more limitations of conventional device structures. Depending upon the embodiment, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming an interconnect structure, the method comprising:
provides a silicon substrate;
forming an interlayer dielectric layer overlying the silicon substrate;
patterning the interlayer dielectric layer to form a contact structure;
forming a barrier metal layer overlying the contact structure, the barrier metal layer having a thickness from about 50 Angstroms to about 500 Angstroms;
forming a seed layer comprising copper bearing species overlying the barrier metal layer;
applying an oxygen bearing species to treat the seed layer to cause an oxide layer of predetermined thickness to form on the seed layer;
protecting the seed layer from contamination using the oxide layer while the substrate is transferred from the step of applying the seed layer, wherein contaminants are attached to surfaces of the oxide layer during the substrate transfer; and
contacting a copper bearing material overlying the oxide layer to dissolve the oxide layer into ionic copper and water while forming a thickness of copper bearing material to fill the contact structure, wherein the dissolving of the oxide layer removes the contaminants.

2. The method of claim 1 wherein the seed layer is deposited using physical vapor deposition or chemical vapor deposition.

3. The method of claim 1 wherein the seed layer is about 500 Angstroms to about 2000 Angstroms.

4. The method of claim 1 wherein the copper bearing material is electro-plated.

5. The method of claim 1 wherein the copper bearing material is provided in a damascene structure.

6. The method of claim 1 wherein the oxygen is derived from gaseous oxygen.

7. The method of claim 1 wherein the forming the seed layer and applying the oxygen bearing species are provided without breaking vacuum.

8. The method of claim 1 wherein the barrier metal layer is tantalum, tantalum nitride, or like materials.

9. The method of claim 1 wherein the interlayer dielectric is a low k dielectric material.

10. A method for forming an integrated circuit device including an interconnect structure, the method comprising:
providing a substrate;
forming an interlayer dielectric layer overlying the substrate;
patterning the interlayer dielectric layer to form a contact structure;
forming a barrier metal layer overlying the contact structure, the barrier metal layer having a thickness from about 50 Angstroms to about 500 Angstroms;
forming a seed layer comprising copper bearing species overlying the barrier metal layer;
applying an oxygen bearing species to treat the seed layer to cause an oxide layer of predetermined thickness to form on the seed layer;
protecting the seed layer from contamination using the oxide layer while the substrate is transferred from the step of applying the seed layer, wherein contaminants are attached to surfaces of the oxide layer during the substrate transfer; and
contacting a copper bearing material overlying the oxide layer to dissolve the oxide layer into ionic copper and water while forming a thickness of copper bearing material to fill the contact structure, wherein the dissolving of the oxide layer removes the contaminants.

11. The method of claim 10 wherein the seed layer is deposited using physical vapor deposition or chemical vapor deposition.

12. The method of claim 10 wherein the seed layer is about 500 Angstroms to about 2000 Angstroms.

13. The method of claim 10 wherein the copper bearing material is electro-plated.

14. The method of claim 10 wherein the copper bearing material is provided in a damascene structure.

15. The method of claim 10 wherein the oxygen is derived from gaseous oxygen.

16. The method of claim 10 wherein the forming the seed layer and applying the oxygen bearing species are provided without breaking vacuum.

17. The method of claim 10 wherein the barrier metal layer is tantalum, tantalum nitride, or like materials.

18. The method of claim 10 wherein the interlayer dielectric is a low k dielectric material.

* * * * *